US010511085B2

(12) United States Patent
Scuteri

(10) Patent No.: US 10,511,085 B2
(45) Date of Patent: Dec. 17, 2019

(54) SYSTEM FOR FASTENING A TELEMATIC MODULE TO THE ROOF OF A MOTOR VEHICLE

(71) Applicant: Magneti Marelli S.p.A., Corbetta (IT)

(72) Inventor: Ilario Scuteri, Corbetta (IT)

(73) Assignee: Magneti Marelli S.p.A., Corbetta (IT)

( * ) Notice: Subject to any disclaimer, the term of this patent is extended or adjusted under 35 U.S.C. 154(b) by 0 days.

(21) Appl. No.: 16/032,536

(22) Filed: Jul. 11, 2018

(65) Prior Publication Data
US 2019/0027817 A1 Jan. 24, 2019

(30) Foreign Application Priority Data

Jul. 18, 2017 (IT) .......................... 102017000081386

(51) Int. Cl.
*H01Q 1/32* (2006.01)
*H01Q 1/12* (2006.01)
*B60R 11/00* (2006.01)
*H05K 7/18* (2006.01)

(52) U.S. Cl.
CPC ........... *H01Q 1/3275* (2013.01); *B60R 11/00* (2013.01); *H01Q 1/1207* (2013.01); *H01Q 1/3233* (2013.01); *H05K 7/186* (2013.01)

(58) Field of Classification Search
CPC .. H01Q 1/3275; H01Q 1/1207; H01Q 1/3233; H01Q 1/325; H01Q 1/3266; H01Q 1/3283; H01Q 1/3291; B60R 11/00; B60R 1/12; B60R 1/04; H05K 7/186
See application file for complete search history.

(56) References Cited

U.S. PATENT DOCUMENTS

| 3,822,049 | A | * | 7/1974 | Saunders | B60R 11/02 248/223.41 |
| 4,103,983 | A | * | 8/1978 | Morrison | B60R 11/0205 248/201 |
| 7,463,135 | B2 | * | 12/2008 | DiCroce | B60R 25/2009 180/287 |
| 9,507,245 | B1 | * | 11/2016 | Druker | G03B 17/566 |

OTHER PUBLICATIONS

Search Report for Italian Patent Application No. 201700081386 dated Mar. 13, 2018.

* cited by examiner

*Primary Examiner* — Dameon E Levi
*Assistant Examiner* — David E Lotter
(74) *Attorney, Agent, or Firm* — Howard & Howard Attorneys PLLC

(57) ABSTRACT

Described herein is a system for fastening a telematic module to the structure of a motor vehicle, in particular to the roof of the motor vehicle, comprising: a telematic module having a closed outer casing and containing at least one first connector for receiving signals and at least one electronic component for processing said signals; and a block for supporting said module, which is to be fixed to said structure of the motor vehicle and is equipped with a second connector designed for connection to said first connector. The system provides for mutual connection of the telematic module to the supporting block that implements an easy and fast mode of connection.

5 Claims, 6 Drawing Sheets

SYSTEM FOR FASTENING A TELEMATIC MODULE TO THE ROOF OF A MOTOR VEHICLE

CROSS-REFERENCE TO RELATED APPLICATIONS

The present application claims priority to and all the benefits of Italian Patent Application No. 102017000081386, filed on Jul. 18, 2017, which is hereby expressly incorporated herein by reference in its entirety.

BACKGROUND OF THE INVENTION

1. Field of the Invention

The present invention relates to a system for fastening a telematic module to the internal structure of a motor vehicle, in particular to the roof.

2. Description of the Related Art

In the automotive sector, increasingly widespread are the so-called telematic boxes, or telematic modules, which operate for the wireless connections of the vehicle, which are made by corresponding antennas by transmitting the data to other devices that are located inside the vehicle, for example in the passenger compartment.

A module of this type may, for example, comprise a telephone module for connection with the mobile communication networks, a multiconstellation satellite localisation module (for example, GPS, GALILEO, GLONASS), etc. The module may moreover comprise also one or more sensors, for detecting conditions of the vehicle, for example a triaxial accelerometer for detecting the acceleration and braking parameters.

In view of the constant need to simplify the processes carried out along a motor-vehicle assembly line, there have already been proposed in this sector quick-coupling systems for fastening telematic modules of the type in question to the roof of the motor vehicle.

SUMMARY OF THE INVENTION

In the above context, the present invention proposes a fastening system that is improved as compared to known systems and has a particularly simple structure that envisages an easy and fast mode of connection.

In particular, the present invention regards a system for fastening a telematic module to a structure of a motor vehicle, in particular to the roof of a motor vehicle. The system includes a telematic module having a closed outer casing and containing at least one first connector for receiving signals and at least one electronic component for processing the signals. A block supports the module, and is fixed to the structure of the motor vehicle and is equipped with a second connector designed for connection to said first connector. The first and second connectors have a configuration of a male-female type that defines a single direction of mutual connection for the first and second connectors. At least one coupling element and a respective receiving seat, the former carried by the block and the latter carried by said module, or vice versa, are coupled together as a result of a movement of the module and the supporting block towards one another in the direction. The coupling element includes a lateral projection or recess, and the supporting block or the module has a manually operable locking member, which carries an interference element and is mobile in a direction transverse to the single direction of connection, between an inactive position, in which said coupling element is allowed to fit into the seat, and an active position, in which the interference element engages the coupling element fitted into the seat at the lateral projection or recess. This prevents extraction of the coupling element from the seat. The locking member has on itself at least two localised surface features for identifying the active and inactive positions.

The claims form an integral part of the technical teaching provided herein in relation to the invention.

BRIEF DESCRIPTION OF THE DRAWINGS

Further characteristics and advantages of the invention will emerge clearly from the ensuing description with reference to the annexed drawings, which are provided purely by way of non-limiting example and in which.

DETAILED DESCRIPTION OF THE INVENTION

Figure 1:
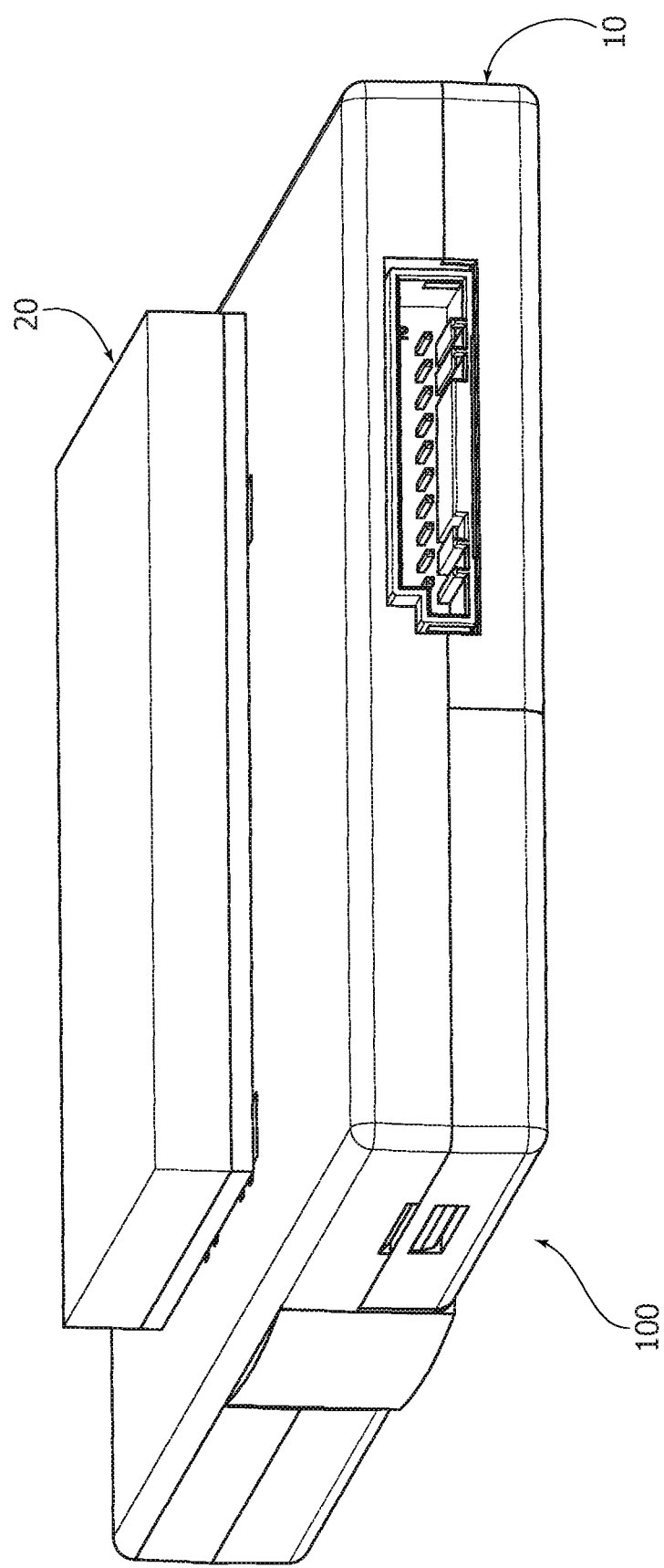
FIG. 1 illustrates an embodiment of the system described herein, according to an axonometric view, in a condition where the telematic module is fixed to the structure of the vehicle.
Figure 2:
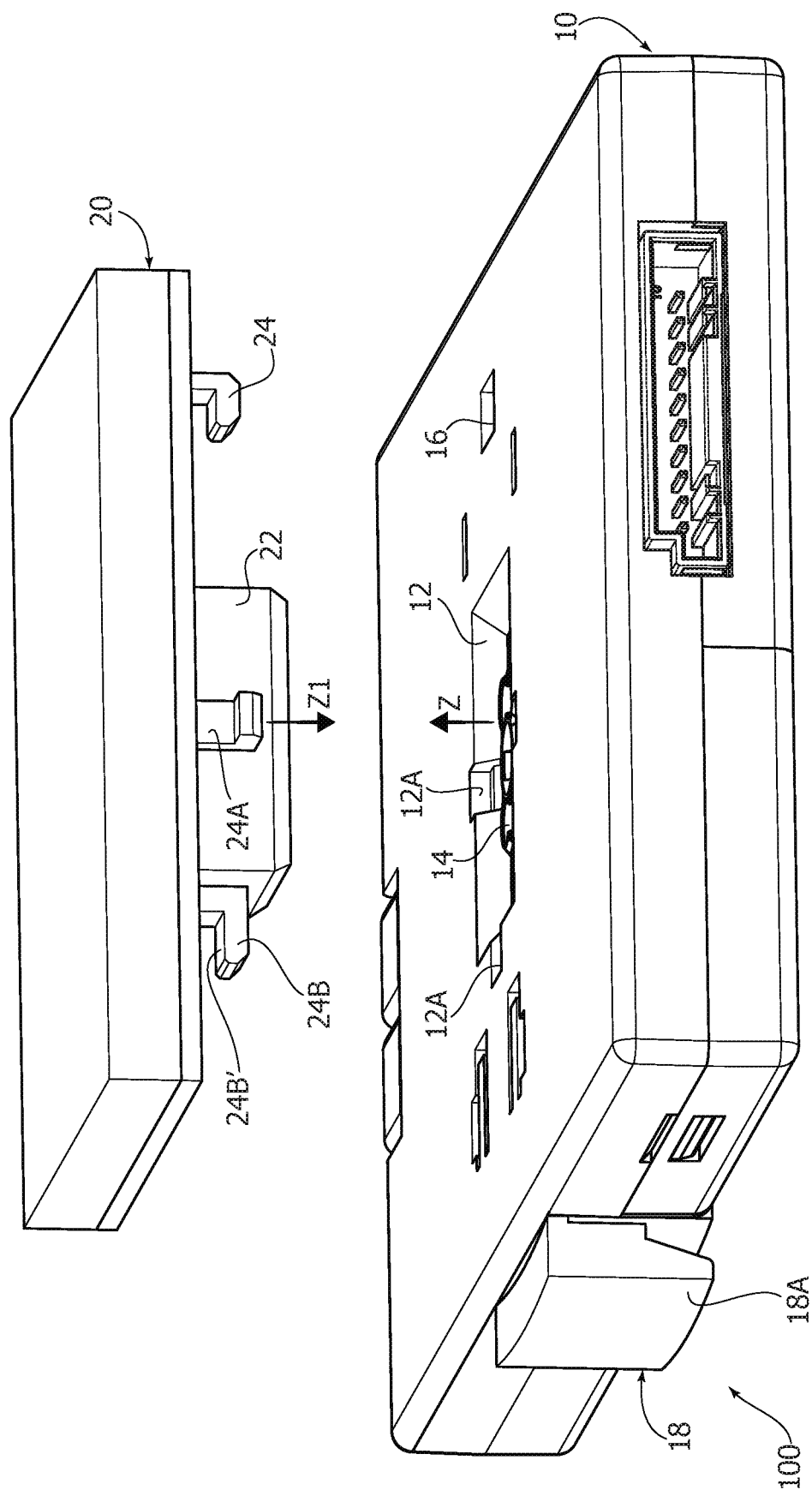
FIG. 2 illustrates the system of FIG. 1 in a condition where the telematic module has been separated from the structure of the vehicle.
Figure 3:
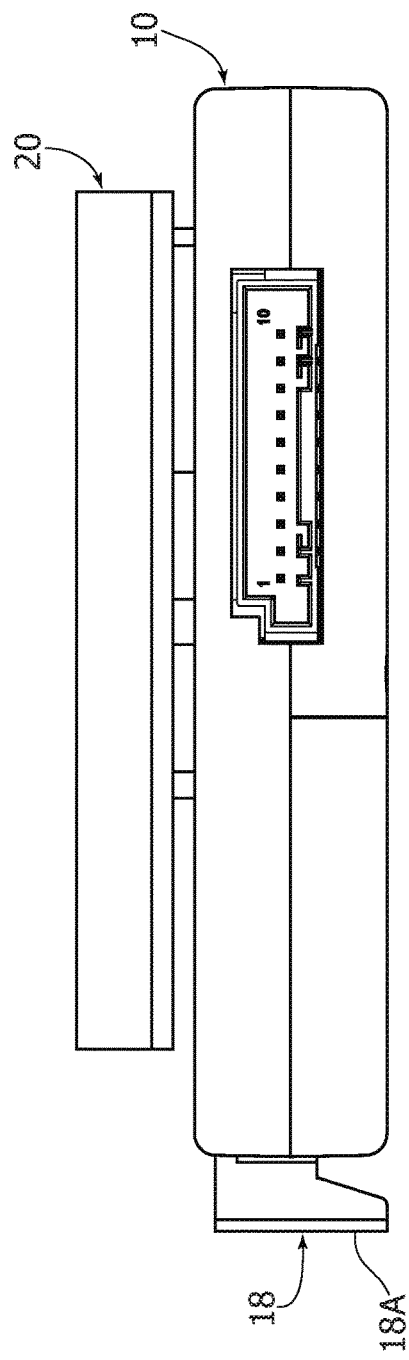
FIG. 3 is a lateral view of the assembled system of FIG. 1, in a condition of release.
Figure 4:
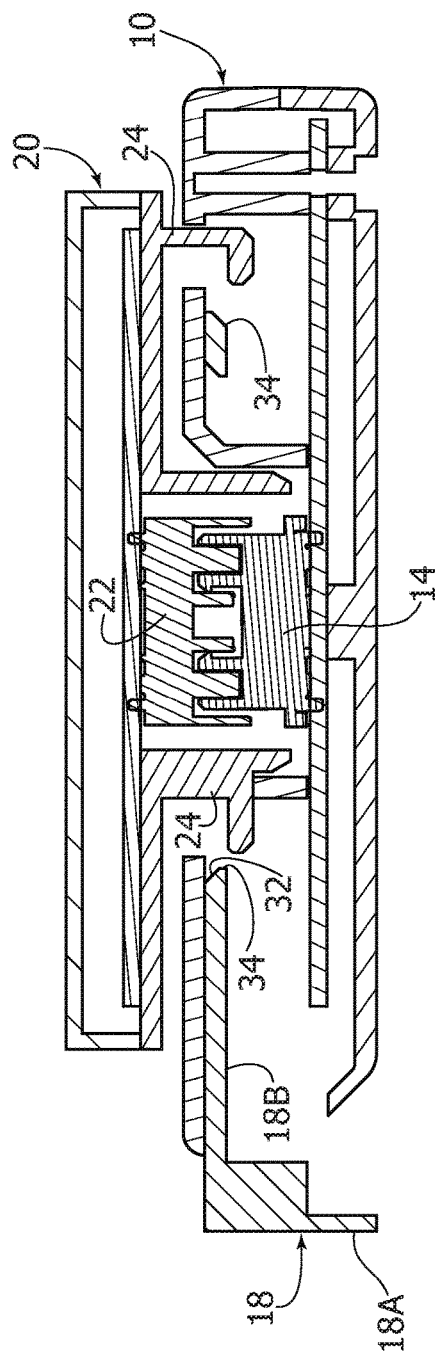
FIG. 4 is a cross-sectional view of the system of FIG. 3 according to a vertical plane of section.
Figure 5:
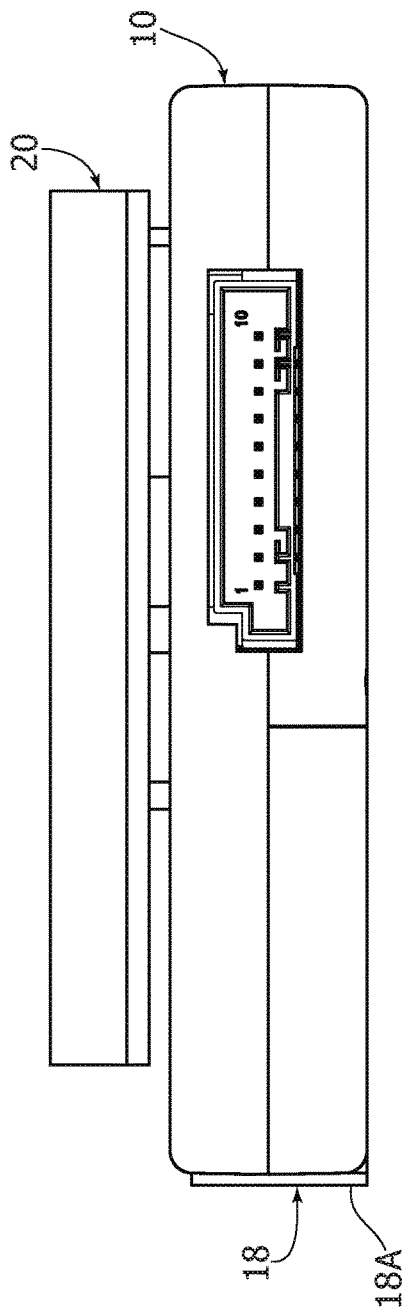
FIG. 5 is a lateral view of the assembled system of FIG. 1, in a clamped condition.
Figure 6:
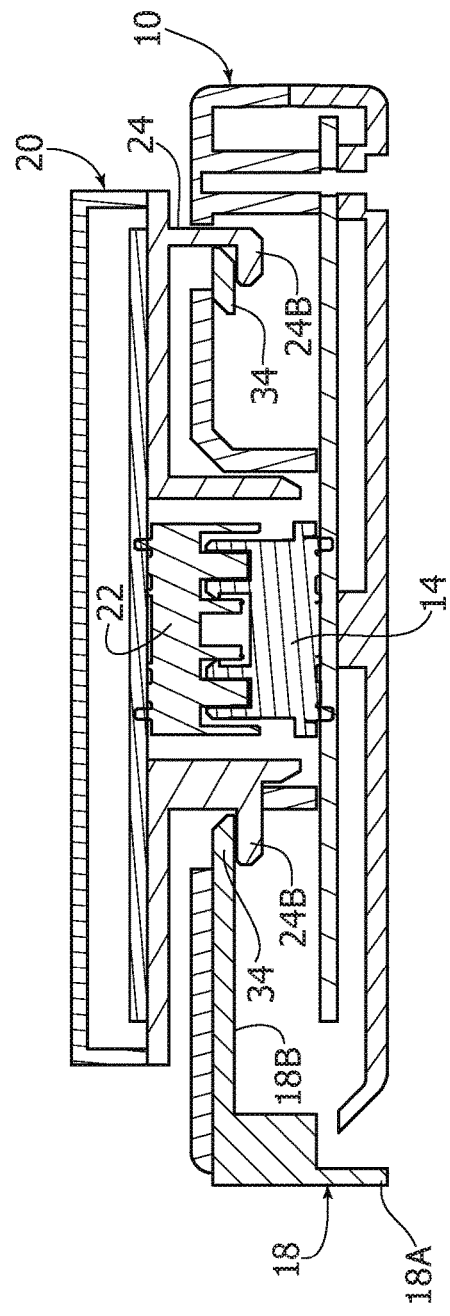
FIG. 6 is a cross-sectional view of the system of FIG. 5 according to a vertical plane of section.
Figure 7:
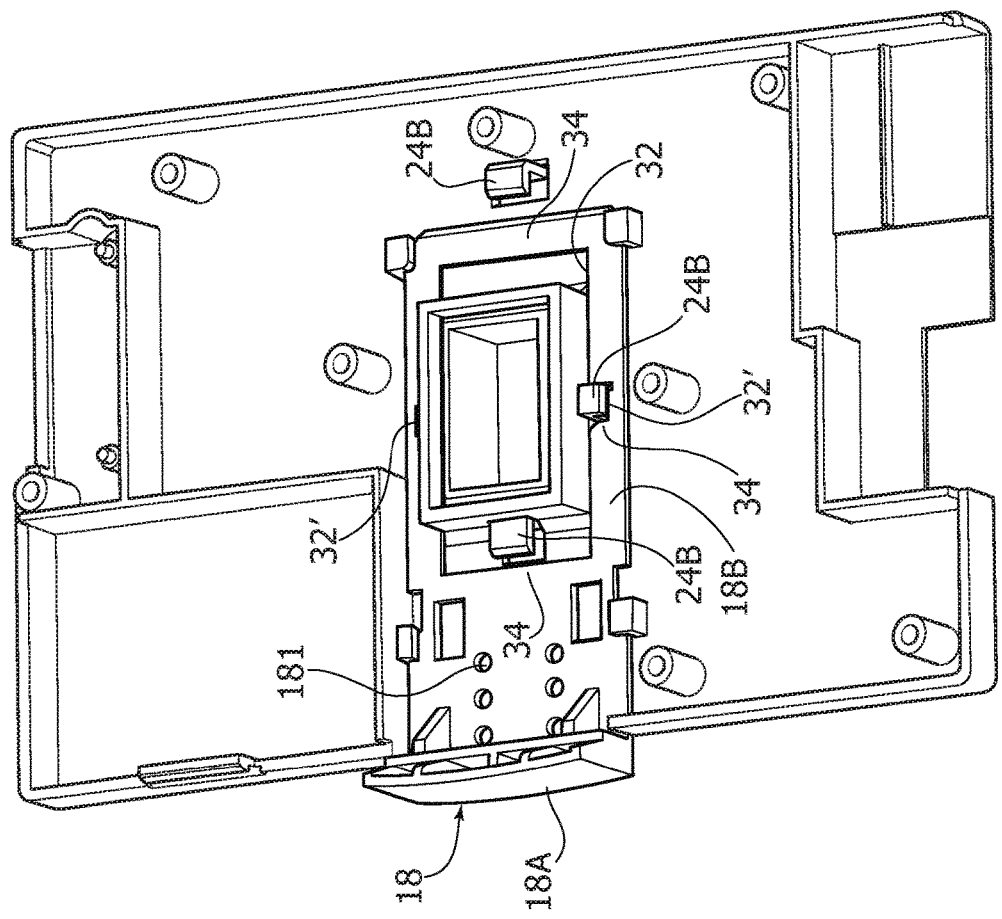
FIG. 7 is a top plan view of the inside of the telematic module, in the condition of release.
Figure 8:
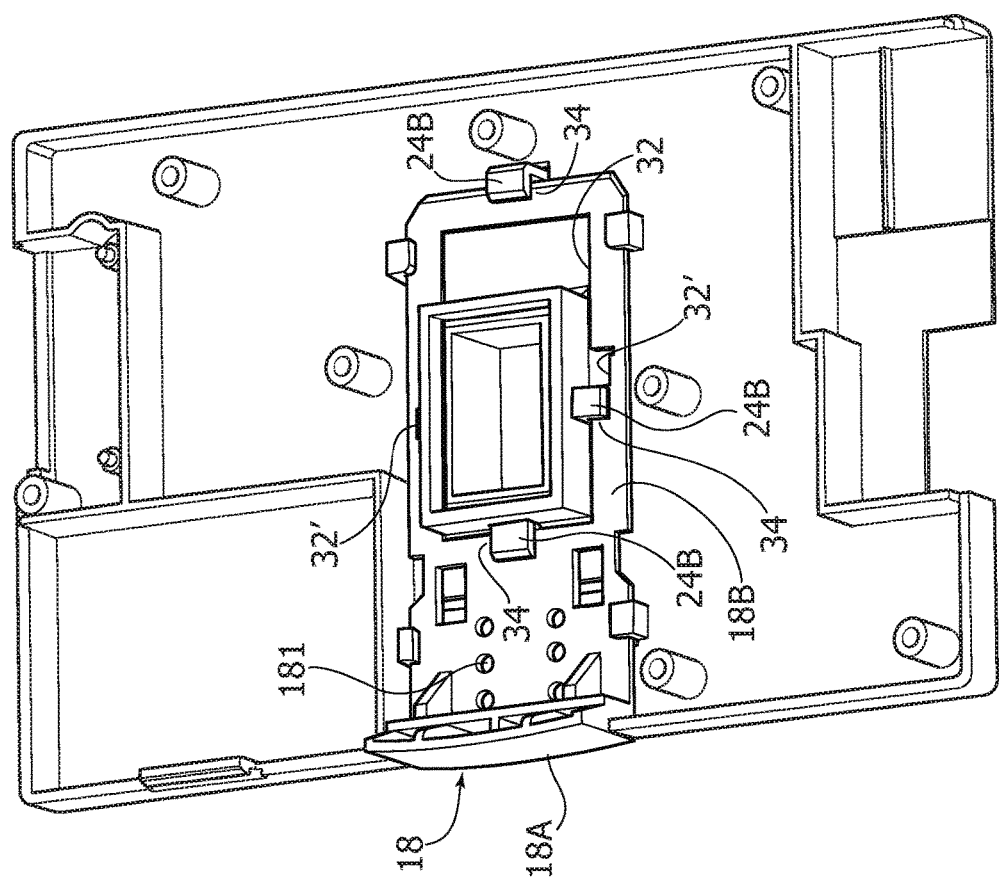
FIG. 8 is a top plan view of the inside of the telematic module, in the clamped condition.

In the ensuing description, illustrated various specific details are illustrated aimed at providing an in-depth understanding of the embodiments. The embodiments may be obtained without one or more of the specific details, or with other methods, components, or materials, etc. In other cases, known structures, materials, or operations are not illustrated or described in detail so that various aspects of the embodiment will not be obscured.

The references used herein are provided merely for convenience and hence do not define the sphere of protection or the scope of the embodiments.

As anticipated above, the system described herein is a system for connection of a telematic module to a structure of a motor vehicle. In particular, the system described herein has been made for connection of the telematic module to the roof of a motor vehicle.

The system comprises a telematic module 100, which is constituted by a closed casing, on the outside of which various connectors give out. Internally, the casing 10 contains electronic circuits/components for processing the signals received and transmitting them to other devices of the motor vehicle.

In various preferred embodiments, as in the one illustrated, the casing 10 has the generic shape of a flattened rectangular parallelepiped. On one of its two major faces (the top one as viewed in the figures), the casing 10 has a central cavity 12, housed within which is a connector 14 equipped with connection parts of a female or male type. The connector 14 is thus oriented so as to define with its connection parts a direction Z, which constitutes the direction of connection of the connector.

The system described herein further comprises a supporting block 20, which is to be fixed to the structure of the motor vehicle, i.e., to the roof in the preferred application referred to.

The block 20 carries on its side that is to be coupled to the casing 10 (i.e., on its underside, as viewed in the figures), a connector 22, which is to couple with the connector 14 and, for this purpose, has connection parts, of a male or female type, complementary to those of the connector 14. Also the connector 22 is oriented so as to define with its connection parts a direction Z1 that constitutes the direction of connection of the connector.

In view of the foregoing, it hence appears clearly that for coupling the two connectors 14 and 22, these will have to be brought into a mutual position in which the directions Z and Z1 referred to above are aligned to one another. From this condition, coupling of the two connectors will then be obtained by moving them up to one another in the directions Z and Z1.

To return to the description of the structure, around the connector 22, the block 20 has on its underside a plurality of hook-like elements 24, which are constituted by stems 24a oriented in a direction parallel to the direction Z1, and by tabs 24b carried by the ends of the stems, which project laterally and identify with their respective top faces 24b' one and the same plane, for the technical reasons that will become evident in what follows.

Accordingly, the cavity 12 of the casing 10 has a plurality of slots 12a, which extend towards the outside of the cavity with respect to the general profile thereof and are mutually positioned so as to be able to receive a corresponding number of hook-like elements 24 of the block 20. In the example illustrated, the slots 12a are three and receive the three hook-like elements 24 arranged immediately adjacent to the connector 22. Moreover, the casing 10 has a further cavity 16 that is to receive the hook-like element 24 that is furthest away from the connector 22.

The telematic module 100 further comprises a locking member 18, which is mounted within the casing 10, projecting outside the latter with an end portion 18a thereof, through a slit made on one side of the casing 10.

The locking member 18 is mounted mobile in a plane parallel to the major faces of the casing, between a retracted position, in which the end 18a is set against the casing 10, and an extracted position, in which the end 18a is set at a distance from the casing 10.

The locking member 18 has a plate-shaped portion 18b, in which an opening 32 is made that substantially reproduces the profile of the cavity 12 of the casing 10. In particular, the opening 32 has a general profile, rectangular in the example illustrated, which is of dimensions such as to be able to receive the connector 22 and made in which are a plurality of slots 32', which extend towards the outside of the profile and are to house the hook-like elements 24 that are located in the proximity of the connector 22. In addition, the plate-shaped portion 18B extends with its end edge as far as the cavity 16 so as to be able to interface with the hook-like element 24 received therein.

In its retracted position referred to above, the locking member 18 sets itself so as to leave free the passage for insertion of the connector 22 and of the hook-like elements 24 into the cavities 12 and 16.

Once the hook-like elements 24 have been inserted into the cavities 12 and 16, the locking member 18 identifies, in the proximity of the tabs 24b of the hook-like elements 24, a series of corresponding edges 34, which come to position themselves in a plane higher than the plane identified by the tabs 24b, with reference to the depth of the cavities 12 and 14.

When the locking member 18 is then brought into its retracted position, the edges 34 move over the respective tabs 24b, thus engaging the faces 24b' thereof. In this condition, the casing 10 is blocked on the supporting block 20.

In view of the foregoing, it will now be understood that the tabs 24b are oriented so as to face the edges 34 with which they are to co-operate.

In various preferred embodiments, as in the one illustrated, the locking member 18 has on its portion 18b a series of notches 181, which are engaged alternatively, in pairs in the example illustrated, by a pair of elastic tabs (not illustrated) carried by the casing 10, which are bent towards the inside. These notches and tabs co-operate to identify different positions of the locking member 18 within the casing 10.

In various preferred embodiments, as in the one illustrated, via these notches three different positions are identified, progressively further inside the casing 10, the first one of which represents a preliminary position that enables identification of proper insertion of the locking member 18 into the casing, and the second and third of which correspond, respectively, to the retracted and extracted operating positions referred to above.

With reference now to operation of the system, in an initial condition the supporting block 20 is already fastened to the roof of the motor vehicle, with its underside accessible from beneath and the connector 22 oriented in space to identify the direction Z. It should now be noted that this block may be constituted by a stand-alone element, as represented in the figure, or else may form part of a more complex component, for example a panel, which is anchored to the roof of the motor vehicle. The fastener used may be of any conventional type, for example glue, screws, bolts, etc.

To fix the telematic module to the supporting block 20, the module must be brought underneath the block 20 into a position in which the connector 14 has its own direction Z aligned with the direction Z1 of the connector 22. In this condition, the cavities 12 and 14 will be likewise aligned with the hook-like elements 24. The locking member 18 is held in its extracted position.

At this point, the module 100 is raised and brought into contact with the supporting block 20, getting the two connectors 22 and 14 to couple and getting the hook-like elements 24 to fit into the respective housings of the cavities 12 and 16. Finally, the locking member 18 can be pushed into its retracted position, thus blocking the casing 10 on the supporting block 20 as a result of mutual engagement between the edges 34 and the hook-like elements 24 of the supporting block 20, according to the modality discussed above.

To remove the module from the supporting block 20, it is sufficient to bring the locking member back into its extracted position, and pull the module away from the block.

In view of the foregoing, it will be noted that the locking member 18, in addition to performing the function of clamping the telematic module on the supporting block 20, also provides an indication, both visual and acoustic, regarding the clamping/release condition, via displacement thereof between the two positions, the extracted one and the retracted one, which can be immediately perceived by the operator, and via the click produced by the tabs of the casing that engage in the respective notches 181 of the locking member 18 whenever one of the two operating positions is reached. These indications guide the operator in operating the locking member 18 properly, and moreover enable immediate verification of clamping/release of the telematic module.

Finally, it should be noted that alternative embodiments may envisage a configuration of the means for mutual connection of the telematic module to the supporting block that is perfectly specular with respect to the one illustrated above, i.e., with the supporting block provided with the cavities 12 and the member 18 and the telematic module provided with the hook-like elements 24.

Of course, without prejudice to the principle of the invention, the details of construction and the embodiments may vary, even significantly, with respect to what has been illustrated herein purely by way of non-limiting example, without thereby departing from the scope of the invention, as defined by the annexed claims.

What is claimed is:

1. A system for fastening a telematic module to a structure of a motor vehicle, in particular to the roof of a motor vehicle, comprising:
    a telematic module having a closed outer casing and containing at least one first connector for receiving signals and at least one electronic component for processing said signals; and
    a block for supporting said module, which is to be fixed to said structure of the motor vehicle and is equipped with a second connector designed for connection to said first connector, wherein said first and second connectors have a configuration of a male-female type that defines a single direction of mutual connection for said first and second connectors;
    at least one coupling element and a respective receiving seat, the former carried by said block and the latter carried by said module, or vice versa, which are to be coupled together as a result of a movement of said module and said supporting block towards one another in said direction;
    wherein said coupling element comprises a lateral projection or recess, and wherein said supporting block or said module has a manually operable locking member, which carries an interference element and is mobile in a direction transverse to said single direction of connection, between an inactive position, in which said coupling element is allowed to fit into said seat, and an active position, in which said interference element engages said coupling element fitted into said seat at said lateral projection or recess, thus preventing extraction of said coupling element from said seat; and
    wherein said locking member has on itself at least two localised surface features for identifying said active and inactive positions.

2. The system as set forth in claim 1, wherein said casing or said supporting block has a face in which a cavity is made, housed within which is said first connector, said direction of connection being transverse to the bottom of said cavity, and wherein said block or said casing has a plane body that carries said second connector, said direction of connection being transverse to said plane body, and wherein said face of said casing or supporting block is designed to be brought into contact with, or adjacent to, said plane body.

3. The system as set forth in claim 2, wherein provided on said plane body, around said second connector, is a plurality of hook-like elements, which constitute said at least one coupling element and have stems, oriented in directions parallel to said direction of connection, and tabs, carried by the ends of said stems, which project laterally and identify with their respective top faces one and the same plane, and wherein said locking member is mounted mobile within said casing or said supporting block and has a plate-shaped portion defining said interference element, in which an opening is made for passage of said first connector into said cavity, and which has a plurality of edges that are to set themselves adjacent to said top faces of said hook-like elements, in said inactive position of said locking member, and to align with said faces in a direction parallel to the direction so as to prevent removal of said casing from said supporting block, in said active position of said locking member.

4. The system as set forth in claim 3, wherein said locking member projects outside said casing or supporting block with an end portion thereof, in said active condition said end portion being set against said casing or supporting block, and in said inactive condition said end portion being set at a distance from said casing or supporting block.

5. The system as set forth in claim 3, wherein said locking member has, on said plate-shaped portion, a series of notches, which are engaged by at least one elastic tab carried by said casing or supporting block, for identifying said active and inactive positions.

* * * * *